(12) United States Patent
Lu

(10) Patent No.: US 7,714,753 B2
(45) Date of Patent: May 11, 2010

(54) SCALABLE CONTEXT ADAPTIVE BINARY ARITHMETIC CODING

(75) Inventor: Ning Lu, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 321 days.

(21) Appl. No.: 12/001,405

(22) Filed: Dec. 11, 2007

(65) Prior Publication Data
US 2009/0146853 A1 Jun. 11, 2009

(51) Int. Cl.
*H03M 7/00* (2006.01)
(52) U.S. Cl. .................. 341/107; 375/240.02; 382/239
(58) Field of Classification Search ........... 341/60–107; 375/240.25, 240.02, E7.001, E7.211, E7.226; 382/232, 239; 706/15–16; 714/794
See application file for complete search history.

(56) References Cited

U.S. PATENT DOCUMENTS

| 6,940,429 B2 * | 9/2005 | Sankaran ............... 341/107 |
| 6,950,040 B2 | 9/2005 | Tsuru ............... 341/50 |
| 7,221,296 B2 * | 5/2007 | Ziauddin et al. ............ 341/107 |
| 7,262,722 B1 | 8/2007 | Jahanghir et al. .......... 341/107 |
| 7,385,535 B2 * | 6/2008 | Yang et al. ................ 341/107 |
| 7,535,387 B1 * | 5/2009 | Delva ..................... 341/107 |
| 7,561,082 B2 * | 7/2009 | Vaithianathan ............. 341/107 |

OTHER PUBLICATIONS

Detlev Marp, et al., "Context-Based Adaptive Binary Arithmetic Coding in the H.264/AVC Video Compression Standard," Jul. 2003, pp. 620-636.

* cited by examiner

*Primary Examiner*—Lam T Mai
(74) *Attorney, Agent, or Firm*—Trop, Pruner & Hu, P.C.

(57) ABSTRACT

One embodiment of the invention concerns performing renormalization in content adaptive binary arithmetic coding (CABAC) only after multiple bins are processed.

15 Claims, 4 Drawing Sheets

SCALABLE CONTEXT ADAPTIVE BINARY ARITHMETIC CODING

BACKGROUND

Content adaptive binary arithmetic coding (CABAC) is an advanced entropy coding technique that may be used in, for example, the MPEG-4 advanced video codec (AVC) video standard as well as HD-DVD and Blu-ray video players. CABAC is a sequential process that may not allow compression of a second bin (i.e., input bit) until a previous first bin has been compressed or packed. To compensate for this sequential characteristic, a pipelined design may be necessary for fast throughput. Even with a pipelined design, however, there may be difficulty in obtaining a deterministic throughput CABAC design that processes, for example, 1 bin per clock cycle. This shortcoming may be due to limitations on conventional CABAC designs that require renormalization after each bin is processed. This renormalization limitation is computationally expensive and may be due to, for example, the unbalanced nature of these designs. In other words, after most bins are processed only a simple check up is required. Thus, in those instances the slow throughput may not manifest its shortcomings. However, in other instances a condensed calculation is required to perform coding. In those instances, a faster throughput may be beneficial.

BRIEF DESCRIPTION OF THE DRAWINGS

The accompanying drawings, incorporated in and constituting a part of this specification, illustrate one or more implementations consistent with the principles of the invention and, together with the description of the invention, explain such implementations. The drawings are not necessarily to scale, the emphasis instead being placed upon illustrating the principles of the invention. In the drawings.

DETAILED DESCRIPTION

The following description refers to the accompanying drawings. Among the various drawings the same reference numbers may be used to identify the same or similar elements. While the following description provides a thorough understanding of the various aspects of the claimed invention by setting forth specific details such as particular structures, architectures, interfaces, and techniques, such details are provided for purposes of explanation and should not be viewed as limiting. Moreover, those of skill in the art will, in light of the present disclosure, appreciate that various aspects of the invention claimed may be practiced in other examples or implementations that depart from these specific details. At certain junctures in the following disclosure descriptions of well known devices, circuits, and methods have been omitted to avoid clouding the description of the present invention with unnecessary detail.

Variables and terms discussed herein may be known to those of ordinary skill in the art and may be defined in, for example, ITU-T Recommendation H.264 entitled "SERIES H: AUDIOVISUAL AND MULTIMEDIA SYSTEMS", which was published by the International Telecommunication Union (ITU) in March, 2005 and is available at, for example, http://www.itu.int/rec/T-REC-H.264-200503-I/en as well as other locations.

Figure 1:
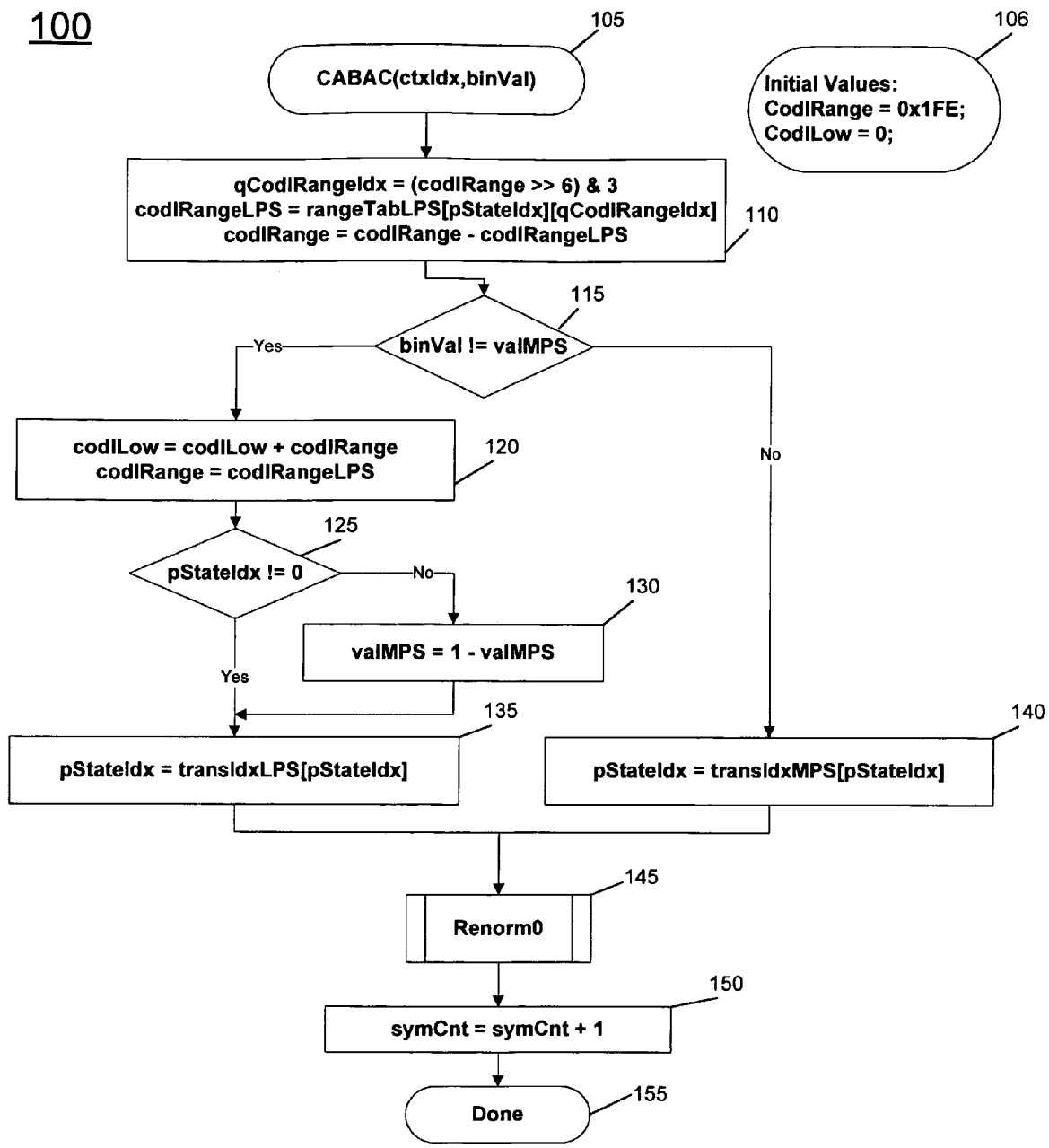
FIG. 1 is a flow chart for a conventional embodiment of CABAC.

FIG. 1 is a flow chart for a conventional embodiment of CABAC. As seen in FIG. 1, the compression process begins in block 105 wherein, for example, one bin value binVal is passed in for processing along with its context identification ctxIdx. binVal may include a data bit of either 0 or 1. ctxIdx may include an index to a statistic model assigned to binVal.

In block 110, the current range codIRange may be, for example only, a number $\geq 256$ and $<512$. For example, in binary codIRange may be a number such as 01abcdefgh, which is initially set as follows: codIRange =0x1FE=510. This initial setting is indicated in block 106. A determination may also be made regarding which of several look-up-table indices will be used. For example, there may be four such indices to select from. Accordingly, qCodIRangeIdx is considered where qCodIRangeIdx represents the two most significant bits after 1 in codIRange (i.e., ab in the above binary notation). Continuing with block 110, a look-up-table may be applied to the range index qCodIRangeIdx. Also, the current statistic state of the given context identification pStateIdx[ctxIdx], such as the new least probable symbol (LPS) range value, may be obtained. For example, codIRangeLPS=rangeTabLPS[pStateIdx][qCodIRangeIdx]. The new most probable symbol (MPS) range, defined as the difference of the LPS range from the overall codIRange, may also be calculated and temporarily put in variable codIRange.

In block 115, a determination may be made regarding whether the current input symbol binVal is the MPS. If the symbol is not the MPS (i.e., the symbol is the LPS), the process proceeds to block 120. In block 120, codILow may be updated and the LPS range codIRangeLPS may be assigned to the new range codIRange. Continuing with the LPS scenario, the statistic state of the current context index may be updated with less favor to the current MPS, as shown in block 135. In block 125, if the current state is already 0 (i.e., there is an equal probability regarding MPS and LPS), the states of the LPS and the MPS are switched as shown in the block 130. In block 140, if the symbol is the MPS, codILow may remain unchanged. The variable codIRange may already be assigned with the MPS range. The state index of the current context index may be the only item that needs to be updated with, for example, the direction of adding more bias towards the MPS. After either of the above two cases, the code range codIRange is reduced. Normalization may be required when codIRange becomes less than 256, as indicated in block 145. In block 150, the bin counter may be updated and made ready for the next call.

Figure 2:
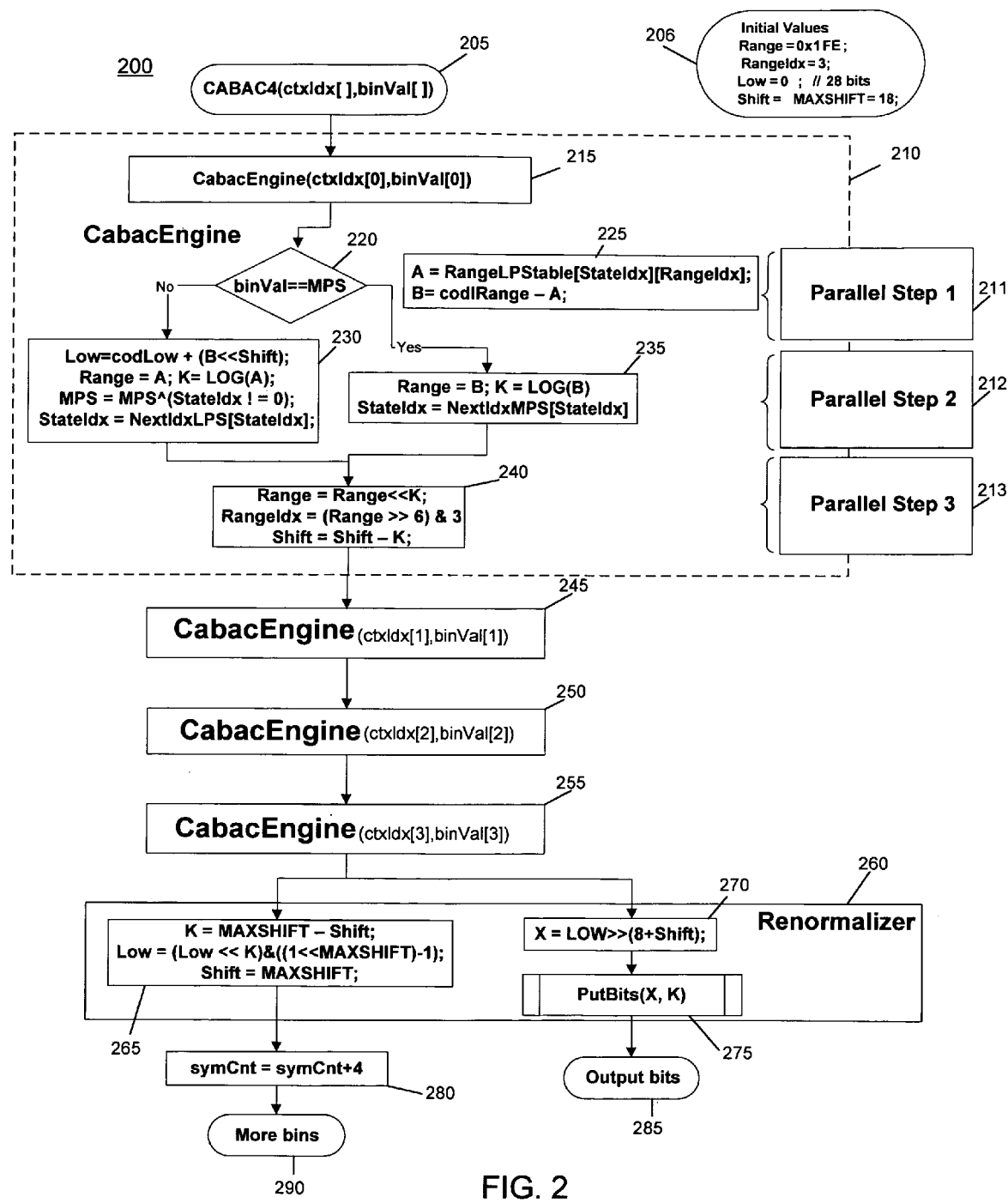
FIG. 2 is a flow chart in one embodiment of the invention.

FIG. 2 is a flow chart in one embodiment of the invention. Initial values may be defined as indicated in block 206. Block 206 may be similar to block 106, except the variable codILow (which may also be referred to herein as Low or codLow) may be assigned to a variable with extended precision of MAX-SHIFT bits such as, for example only, 18 bits. In other words, in some CABAC designs for MPEG-4 AVC (i.e., H.264) the smallest possible LPS range may be 6, and (6<<6)=384>256. Therefore, in one embodiment of the invention an extra 6 bits is provided to codILow. In FIG. 2, an additional three pipelined CABAC engines 245, 250, 255 accompany CABAC engine 210. Thus, in one embodiment of the invention an extra six bits are assigned per additional CABAC engine. This may result in the aforementioned assignment of an additional 18 bits. This extra precision may thereby allow renormalization to be delayed by encoding one more bin or additional bins. Consequently, in the case of 18 bits, up to four consecutive bin-encodings may be performed without requiring renormalization.

Block 205 is analogous to block 105 of FIG. 1, but four pairs of inputs are handled in this particular embodiment of the invention. In block 215, the first bin value may be encoded with an associated context index. Differing from FIG. 1, the range index RangeIdx may be calculated earlier in one embodiment of the invention. Thus, in block 225 the same LPS range may be obtained and assigned to A along with assigning the MPS range to B. At or substantially at the same time, an embodiment of the invention may determine whether the current bin is MPS or LPS as shown in Block 220. An exemplary LPS range look-up table is provided below.

TABLE 1

```
int rangeLPStable[64][4] =
{
    {128, 176, 208, 240}, {128, 167, 197, 227}, {128, 158, 187, 216},
    {123, 150, 178, 205}, {116, 142, 169, 195}, {111, 135, 160, 185},
    {105, 128, 152, 175}, {100, 122, 144, 166}, { 95, 116, 137, 158},
    { 90, 110, 130, 150}, { 85, 104, 123, 142}, { 81, 99, 117, 135},
    { 77, 94, 111, 128}, { 73, 89, 105, 122}, { 69, 85, 100, 116},
    { 66, 80, 95, 110}, { 62, 76, 90, 104}, { 59, 72, 86, 99},
    { 56, 69, 81, 94}, { 53, 65, 77, 89}, { 51, 62, 73, 85},
    { 48, 59, 69, 80}, { 46, 56, 66, 76}, { 43, 53, 63, 72},
    { 41, 50, 59, 69}, { 39, 48, 56, 65}, { 37, 45, 54, 62},
    { 35, 43, 51, 59}, { 33, 41, 48, 56}, { 32, 39, 46, 53},
    { 30, 37, 43, 50}, { 29, 35, 41, 48}, { 27, 33, 39, 45},
    { 26, 31, 37, 43}, { 24, 30, 35, 41}, { 23, 28, 33, 39},
    { 22, 27, 32, 37}, { 21, 26, 30, 35}, { 20, 24, 29, 33},
    { 19, 23, 27, 31}, { 18, 22, 26, 30}, { 17, 21, 25, 28},
    { 16, 20, 23, 27}, { 15, 19, 22, 25}, { 14, 18, 21, 24},
    { 14, 17, 20, 23}, { 13, 16, 19, 22}, { 12, 15, 18, 21},
    { 12, 14, 17, 20}, { 11, 14, 16, 19}, { 11, 13, 15, 18},
    { 10, 12, 15, 17}, { 10, 12, 14, 16}, { 9, 11, 13, 15},
    { 9, 11, 12, 14}, { 8, 10, 12, 14}, { 8, 9, 11, 13}, { 7, 9, 11, 12},
    { 7, 9, 10, 12}, { 7, 8, 10, 11}, { 6, 8, 9, 11}, { 6, 7, 9, 10},
    { 6, 7, 8, 9}, { 2, 2, 2, 2}
};
```

An example of a state index table is provided below.

TABLE 2

```
const int NextStateMPS[64] =
{
    1, 2, 3, 4, 5, 6, 7, 8,
    9,10,11,12,13,14,15,16,
    17,18,19,20,21,22,23,24,
    25,26,27,28,29,30,31,32,
    33,34,35,36,37,38,39,40,
    41,42,43,44,45,46,47,48,
    49,50,51,52,53,54,55,56,
    57,58,59,60,61,62,62,63
};
const int NextStateLPS[64] =
{
    0, 0, 1, 2, 2, 4, 4, 5,
    6, 7, 8, 9, 9,11,11,12,
    13,13,15,15,16,16,18,18,
    19,19,21,21,22,22,23,24,
    24,25,26,26,27,27,28,29,
    29,30,30,30,31,32,32,33,
    33,33,34,34,35,35,35,36,
    36,36,37,37,37,38,38,63
};
```

In the LPS scenario, as shown in block 230, one embodiment of the invention may update Low, assign A to Range (which may also be referred to herein as CodIRange or CodRange), calculate LOG(A), update MPS, and adjust the state index StateIdx of the current context index all in parallel or substantially in parallel, for none of them depends on the results of the others. In one embodiment of the invention, LOG(A) may be defined as the minimal shift needed for A to be greater than or equal to 256 (i.e., (A<<LOG(A))≧256, and (A<<LOG(A))<512).

Similarly, in the MPS scenario, as shown in block 235, one embodiment of the invention may assign B to Range, calculate LOG(B), and adjust the state index StateIdx of the current context index all in parallel or substantially in parallel, for none of them depends on the results of the others. In block 240, instead of completing the full renormalization, one embodiment of the invention shifts Range to a value within [256,512), and obtains the range index RangeIdx for the next bin and update Shift variable.

In one embodiment of the invention, blocks 211, 212, and 213 may mark three dependent sequential steps the CABAC engine 210 may take. Within each step, all or some calculations or operations can be done in parallel, independently, and within one operation. For example, in block 211 all operations found in blocks 220, 225 (or a subset of those operations) may be performed in parallel, independently of one another, within one operation. In block 212 all operations found in blocks 230, 235 (or a subset of those operations) may be performed in parallel, independently of one another, within one operation. In block 213 all operations found in block 240 (or a subset of those operations) may be performed in parallel, independently of one another, within one operation. By doing so, a CABAC engine is achieved that, in one embodiment of the invention, can encode one bin in the time it takes for three operations to complete. The number of operations may vary depending on the design of a processor or processors used. For example, in another embodiment of the invention five operations may be required to process or encode one bin.

Blocks 245, 250, 255 may include substantially similar or even identical CABAC engines as engine 210. By coupling four engines together and pushing their numerous operations (e.g., twelve) into one clock cycle, the CABAC encoder may process 4 bins per clock throughput or clock cycle in one embodiment of the invention. Thus, various embodiments of the invention may be performed using any number of blocks similar to 210, 245, 250, 255, which may be pipelined.

Renormalization may occur in block 260 after bin processing by one or more engines. Regarding block 265, the renormalization process may be improved by branching renormalization into, for example, two pieces such as updating Low and resetting Shift. In one embodiment of the invention, both branches may be performed in parallel in one operation. In an embodiment of the invention, both branches may be performed in the same clock cycle as the earlier operations. Regarding the other thread depicted in block 270, the thread may produce a bitstream with no feedback requirement. In the other words, the CABAC engine 210 may begin to take the next four inputs after block 260 without waiting for anything derived from the branch starting from 270. Thus, in block 280, which can be performed in the same operation as block 265, the bin counter may be updated and made ready for the next call as put in block 290. In block 270, the output bits may be calculated and in bock 275, the actual output incremental issues may be processed and written into the bitstream buffer as shown in block 285. The method of block 275 of FIG. 2 is further explained in FIG. 3.

Figure 3:
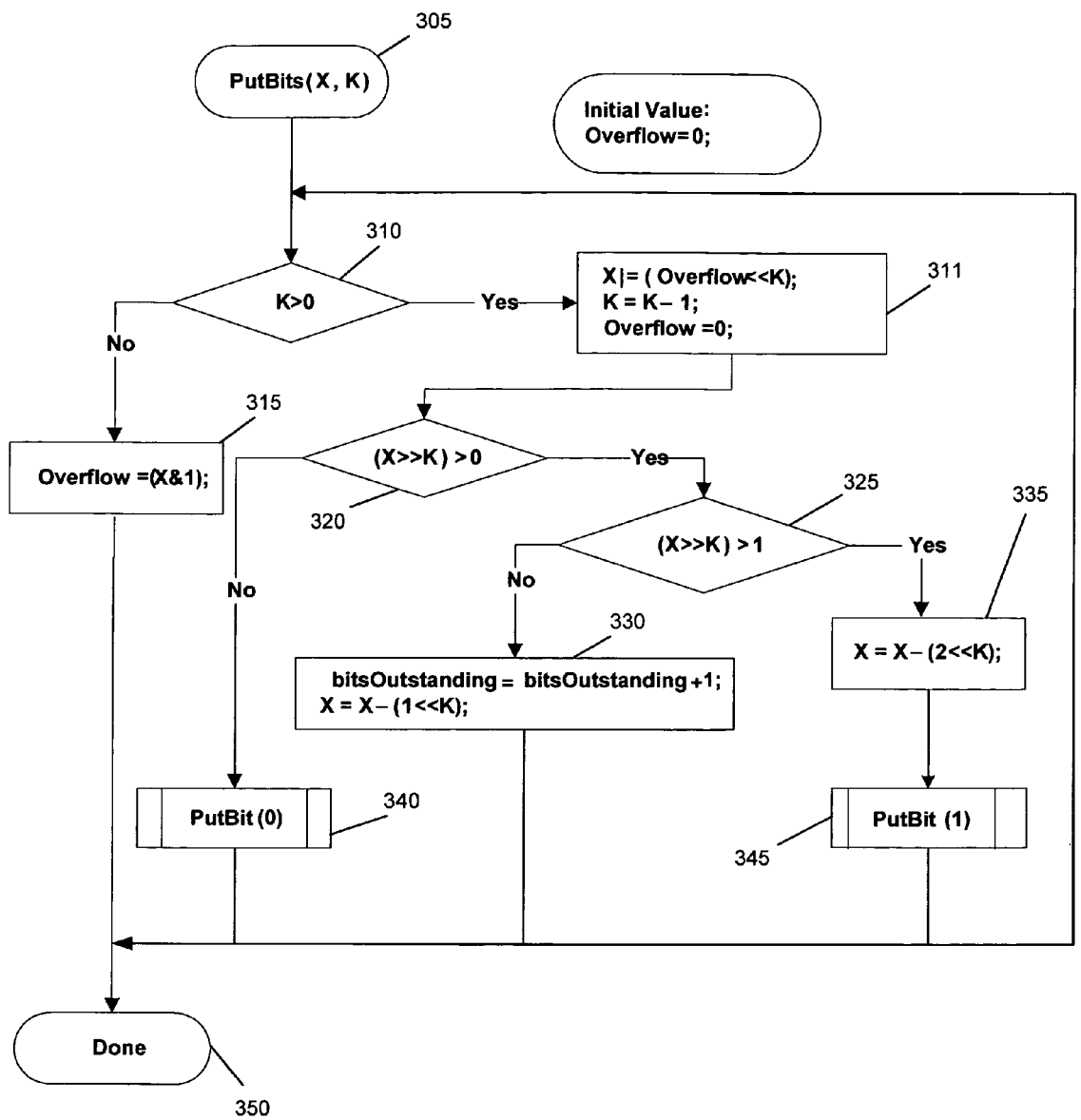
FIG. 3 is a flow chart in one embodiment of the invention.

FIG. 3 is a flow chart in one embodiment of the invention of an output bit stream. In block 305, the output value X may exist in K bits. If K has nothing left (after block 310), the overflow bit may be stored if there is any as shown in block 315. If K is more than 0 (310), X is updated with overflow bit(s) and K is decreased in block 311. In block 320, if the top two bits are 00, 0 (block 340) may be output. If the top two bits are 01, the outstanding bit number (block 330) may be increased and the top two bits may be set to 00. If the top two bits are either 10 or 11, 1 (block 345) may be output and the top bit removed to become 00 or 01 (as equivalent to block 335).

Thus, as indicated above, various embodiments of the invention may include a CABAC process with extended bits for codILow. The process may be managed by the shift variable Shift. Furthermore, multiple CABAC engines may be pipelined therein. In one embodiment of the invention, four such engines 210, 245, 250, 255 (FIG. 2) may be utilized with a single renormalization step 260. As indicated in blocks 265, 270 the only step left in the renormalization process may be, in one embodiment of the invention, a simple shift. The other logic functions may be pushed to block 275, which may be pipelined independently.

Therefore, by rearranging data flow as shown above, one may locate the logic functions of the CABAC engine 210 into parallel logic operation steps 211, 212, 213. Also, the last step 240 of the first engine 210 may overlap with the first step of the second engine 245 and so on. One embodiment of the invention assumes 13 or more logic operations may be performed per clock cycle (e.g., 3 operations per engine for 4 engines, and 1 operation for renormalization update). In one embodiment of the invention, the process of FIG. 2 may extend to process 4-8 bins per clock cycle if 12-25 operations are conducted in a single clock cycle. Thus, in one embodiment of the invention multiple bins may be processed per clock cycle. The above improvements may be due, in part, to performing renormalization after multiple bins are processed instead of renormalizing after each bin. By moving the output bitstream creation of the renormalization process into a branch independent from the core sequential loop of dependency (e.g., separate block 265 and branch 270 of FIG. 2), various embodiments of the invention may be able to put bin-encoding and bitstream output into two concurrent pipelines.

In one embodiment of the invention, renormalization may ensure the state variable codIRange (which may also be referred to herein as Range or codRange) falls between 256 and 512 (i.e., 9 valid bits) by shifting up. Therefore, one embodiment of the invention may produce identical results by starting codILow with extra Shift bits that are enlarged relative to conventional practices (e.g., 8 bits). In that case, no actual renormalization may be delayed unless the process runs out of the extra bits and as long as the process keeps tracking the shifting number Shift.

Since the minimal range number codIRange is greater or equal to MINRANGE=6, in one embodiment of the invention shift number Shift may be greater than MAXSHIFT=6. This may cause delay of renormalization until after processing one extra bin (and/or a predetermined number of bins), for (6<<6)= 384, within [256,512). If one desires to perform renormalization no sooner than after N bins, one need only add (N−1)* MAXSHIFT extra bits for the normalized codIRange. In one embodiment of the invention, there may be an extra 6 bits allotted to the range for every bin renormalization delay.

As those of ordinary skill in the art will appreciate, the above embodiments of CABAC engines my be utilized in any number of different encoding solutions.

Figure 4:
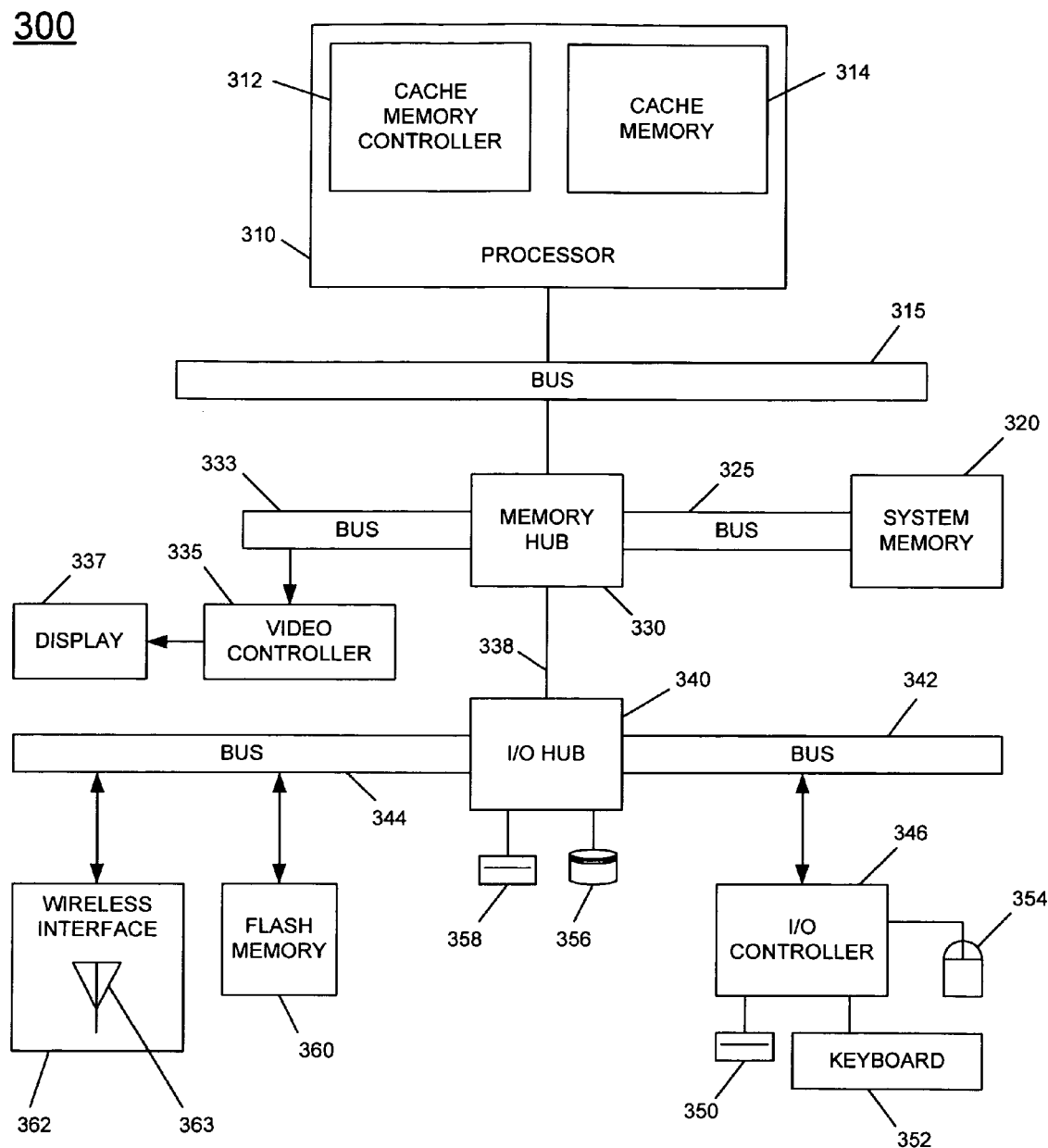
FIG. 4 is a block diagram of a system for use with one embodiment of the invention.

Now referring to FIG. 4, in one embodiment, computer system 300 includes a processor 310, which may include a general-purpose or special-purpose processor such as a microprocessor, microcontroller, a programmable gate array (PGA), and the like. Processor 310 may include a cache memory controller 312 and a cache memory 314. While shown as a single core, embodiments may include multiple cores and may further be a multiprocessor system including multiple processors 310. Processor 310 may be coupled over a host bus 315 to a memory hub 330 in one embodiment, which may be coupled to a system memory 320 (e.g., a dynamic RAM) via a memory bus 325. Memory hub 330 may also be coupled over an Advanced Graphics Port (AGP) bus 333 to a video controller 335, which may be coupled to a display 337.

Memory hub 330 may also be coupled (via a hub link 338) to an input/output (I/O) hub 340 that is coupled to an input/output (I/O) expansion bus 342 and a Peripheral Component Interconnect (PCI) bus 344, as defined by the PCI Local Bus Specification, Production Version, Revision 2.1 dated June 1995. I/O expansion bus 342 may be coupled to an I/O controller 346 that controls access to one or more I/O devices. These devices may include in one embodiment storage devices, such as a disk drive 350 and input devices, such as a keyboard 352 and a mouse 354. I/O hub 340 may also be coupled to, for example, a hard disk drive 358 and a compact disc (CD) drive 356. It is to be understood that other storage media may also be included in the system.

PCI bus 344 may also be coupled to various components including, for example, a flash memory 360. A wireless interface 362 may be coupled to PCI bus 344, which may be used in certain embodiments to communicate wirelessly with remote devices. Wireless interface 362 may include a dipole or other antenna 363 (along with other components not shown). While such a wireless interface may vary in different embodiments, in certain embodiments the interface may be used to communicate via data packets with a wireless wide area network (WWAN), a wireless local area network (WLAN), a BLUETOOTH™, ultrawideband, a wireless personal area network (WPAN), or another wireless protocol. In various embodiments, wireless interface 362 may be coupled to system 300, which may be a notebook or other personal computer, a cellular phone, personal digital assistant (PDA) or the like, via an external add-in card or an embedded device. In other embodiments wireless interface 362 may be fully integrated into a chipset of system 300. In one embodiment of the invention, a network controller (not shown) may be coupled to a network port (not shown) and the PCI bus 344. Additional devices may be coupled to the I/O expansion bus 342 and the PCI bus 344. Although the description makes reference to specific components of system 300, it is contemplated that numerous modifications and variations of the described and illustrated embodiments may be possible.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   receiving a first input bit (bin) in a first content adaptive binary arithmetic coding (CABAC) encoding engine;
   CABAC encoding the first bin;
   receiving a second bin in the first CABAC encoding engine;
   CABAC encoding the second bin; and
   beginning an initial renormalization based on the first encoded bin after encoding the second bin has begun.

2. The method of claim 1, further comprising completely encoding the first bin in a first clock cycle.

3. The method of claim 2, further comprising:
   receiving a third bin in a second CABAC encoding engine;
   CABAC encoding the third bin;
   receiving a fourth bin in the second encoding engine;
   CABAC encoding the fourth bin; and
   beginning an initial renormalization based on the third encoded bin after encoding the fourth bin has begun.

4. The method of claim 3, further comprising completely encoding the third bin in the first clock cycle.

5. The method of claim 1, wherein performing the initial renormalization based on the first encoded bin is based on a range previously assigned a first amount of additional bits, the first amount of additional bits being based on a number of additional CABAC encoding engines pipelined with the first CABAC encoding engine.

6. The method of claim 3, wherein the initial renormalization based on the first encoded bin and the initial renormalization based on the third encoded bin are performed independently of one another.

7. The method of claim 3, further comprising simultaneously receiving the first bin in a first pipeline and the third bin in a second pipeline.

8. The method of claim 1, wherein performing the initial renormalization based on the first encoded bin includes producing the first bin into an encoded bitstream after the second bin is received.

9. The method of claim 4, further comprising:
   receiving a fifth bin in a third CABAC encoding engine;
   CABAC encoding the fifth bin;
   receiving a sixth bin in the third encoding engine;
   CABAC encoding the sixth bin;
   beginning an initial renormalization based on the fifth encoded bin after encoding the sixth bin has begun;
   receiving a seventh bin in a fourth CABAC encoding engine;
   CABAC encoding the seventh bin;
   receiving an eighth bin in the fourth encoding engine;
   CABAC encoding the eighth bin; and
   beginning an initial renormalization based on the seventh encoded bin after encoding the eight bin has begun;
   wherein the fifth and seventh bins are each completely encoded in the first clock cycle.

10. An article comprising a medium storing instructions that enable a processor-based system to:
    receive a first bin in a first content adaptive binary arithmetic coding (CABAC) encoding engine;
    CABAC encode the first bin;
    receive a second bin in the first CABAC encoding engine;
    CABAC encode the second bin; and
    begin a renormalization based on the first bin after encoding the second bin has begun.

11. The article of claim 10, further storing instructions that enable the processor-based system to encode the first bin in a first clock cycle.

12. The article of claim 11, further storing instructions that enable the processor-based system to:
    receive a third bin in a second CABAC encoding engine;
    CABAC encode the third bin;
    receive a fourth bin in the second encoding engine;
    CABAC encode the fourth bin; and
    begin a renormalization based on the third bin after encoding the fourth bin has begun.

13. The article of claim 12, further storing instructions that enable the processor-based system to encode the third bin in the first clock cycle.

14. The article of claim 10, further storing instructions that enable the processor-based system to perform the renormalization based on the first bin in response to a range previously assigned a first amount of additional bits, the first amount of additional bits being based on one or more additional CABAC encoding engines being pipelined with the first CABAC encoding engine.

15. The article of claim 10, further storing instructions that enable the processor-based system to produce the first bin into an encoded bitstream independently of when the second bin is received.

* * * * *